(12) United States Patent
Sugimoto et al.

(10) Patent No.: US 12,278,122 B2
(45) Date of Patent: Apr. 15, 2025

(54) HEATING DEVICE AND HEATING METHOD

(71) Applicant: TOKYO ELECTRON LIMITED, Tokyo (JP)

(72) Inventors: Takashi Sugimoto, Yamanashi (JP); Hiroyuki Takahashi, Yamanashi (JP); Shinya Okano, Yamanashi (JP)

(73) Assignee: Tokyo Electron Limited, Tokyo (JP)

( * ) Notice: Subject to any disclaimer, the term of this patent is extended or adjusted under 35 U.S.C. 154(b) by 740 days.

(21) Appl. No.: 17/478,492

(22) Filed: Sep. 17, 2021

(65) Prior Publication Data

US 2022/0093422 A1 Mar. 24, 2022

(30) Foreign Application Priority Data

Sep. 24, 2020 (JP) ................................ 2020-159644

(51) Int. Cl.
*H01L 21/67* (2006.01)
*H01L 21/268* (2006.01)
*H05B 1/02* (2006.01)
*H05B 3/00* (2006.01)

(52) U.S. Cl.
CPC .... *H01L 21/67115* (2013.01); *H01L 21/2686* (2013.01); *H05B 1/0233* (2013.01); *H05B 3/0047* (2013.01); *H05B 2203/005* (2013.01)

(58) Field of Classification Search
CPC ........... H01L 21/67115; H01L 21/2686; H01L 21/324
See application file for complete search history.

(56) References Cited

U.S. PATENT DOCUMENTS

| | | | |
|---|---|---|---|
| 8,993,933 B2* | 3/2015 | Serebryanov | H01L 21/67115 |
| | | | 118/724 |
| 9,899,242 B2* | 2/2018 | Schaller | H01L 21/67196 |
| 10,741,457 B2* | 8/2020 | Aderhold | H01L 21/67248 |
| 11,994,374 B2* | 5/2024 | Dotan | G03F 7/706849 |
| 12,080,573 B2* | 9/2024 | Luckner | H01L 21/324 |
| 2017/0309529 A1* | 10/2017 | Aderhold | H01L 21/324 |
| 2021/0398830 A1* | 12/2021 | Sugimoto | H01L 21/324 |
| 2022/0015213 A1* | 1/2022 | Kitagawa | G05D 23/27 |
| 2022/0093422 A1* | 3/2022 | Sugimoto | H01L 21/67248 |

FOREIGN PATENT DOCUMENTS

| | | | | |
|---|---|---|---|---|
| JP | 2008288451 A | | 11/2008 | |
| JP | 2009-076705 A | | 4/2009 | |
| JP | 2010045106 A | | 2/2010 | |
| WO | WO-2020105036 A1 * | | 5/2020 | ............. G01B 11/02 |

* cited by examiner

*Primary Examiner* — Mary A Wilczewski
(74) *Attorney, Agent, or Firm* — Fenwick & West LLP (57) ABSTRACT

A heating device for heating a substrate is provided. The heating device comprises a support portion configured to support the substrate, and a light irradiation unit configured to heat the substrate by irradiating the substrate supported by the support portion with light. A plurality of zones are set in the light irradiation unit, and each of the plurality of zones set in the light irradiation unit irradiates different portions of a surface of the substrate suppoereted by the support portion with light. During the heating by the light irradiation unit, the plurality of zones take turns so that some zones of the plurality of zones are utilized.

8 Claims, 9 Drawing Sheets

HEATING DEVICE AND HEATING METHOD

CROSS-REFERENCE TO RELATED APPLICATIONS

This application claims priority to and the benefit of Japanese Patent Application No. 2020-159644 filed on Sep. 24, 2020, the disclosure of which is incorporated herein by reference in its entirety.

TECHNICAL FIELD

The present disclosure relates to a heating device and a heating method.

BACKGROUND

Japanese Patent Application Publication No. 2009-76705 discloses a load lock device for transporting a substrate between a vacuum chamber in a vacuum state and a space at atmospheric pressure. This load lock device includes a first opening/closing mechanism that is provided to open or close between the vacuum chamber and a container, in which the pressure can be changed between a pressure corresponding to the vacuum chamber and the atmospheric pressure, and a second opening/closing mechanism that is provide to open or close between the space at atmospheric pressure and the container. Further, the load lock device includes a pressure adjusting mechanism that adjusts the pressure in the container to a pressure corresponding to a degree of vacuum when the first opening/closing mechanism is opened and the inside of the container communicates with the vacuum chamber, and adjusts the pressure in the container to the atmospheric pressure when the second opening/closing mechanism is opened and the inside of the container communicates with the space having the atmospheric pressure. Moreover, the load lock device includes a placement table which is provided in the container and on which the substrate is placed, and a heating mechanism for heating the substrate provided on the placement table, and the heating mechanisms has a heating source in which a solid light emitting element is mounted.

SUMMARY

A technology according to the present disclosure is to heat a substrate with light from a light emitting element even when a power source having low output power is used.

A heating device for heating a substrate is provided. The heating device comprises a support portion configured to support the substrate; and a light irradiation unit configured to heat the substrate by irradiating the substrate supported by the support portion with light, wherein a plurality of zones are set in the light irradiation unit, and each of the plurality of zones set in the light irradiation unit irradiates different portions of a surface of the substrate supporeted by the support portion with light, and during the heating by the light irradiation unit, the plurality of zones take turns so that some zones of the plurality of zones are utilized.

DETAILED DESCRIPTION

In a manufacturing process of semiconductor devices, a process of heating a substrate such as a semiconductor wafer (hereinafter, referred to as "wafer") is performed.

As a method of heating a substrate, as in Japanese Patent Application Publication No. 2009-76705, there is a method of using a heat source including a plurality of solid light emitting element arrays in which a plurality of solid light emitting elements are mounted on a support. In Japanese Patent Application Publication No. 2009-76705, the substrate is heated by absorbing electromagnetic waves (light) generated by the solid light emitting elements into the substrate which is subject to heating.

When the heating source including the plurality of solid light emitting element arrays is used as in Japanese Patent Application Publication No. 2009-76705, for example, all the plurality of solid light emitting element arrays are used at the same time for heating the substrate. However, when all the plurality of solid light emitting element arrays are used at the same time, a power source having high output power is required as a power source for supplying electric power to the heating source. The power source having high output power is expensive and large.

Therefore, the technology according to the present disclosure makes it possible to heat a substrate with light from a light emitting element even when a power source having low output power is used.

Hereinafter, a heating device and a heating method according to the present embodiment will be described with reference to the accompanying drawings. Moreover, in the present specification and the drawings, elements having substantially the same functional configuration are designated by the same reference numerals, and overlapping descriptions thereof will be omitted.

First Embodiment

Figure 1:
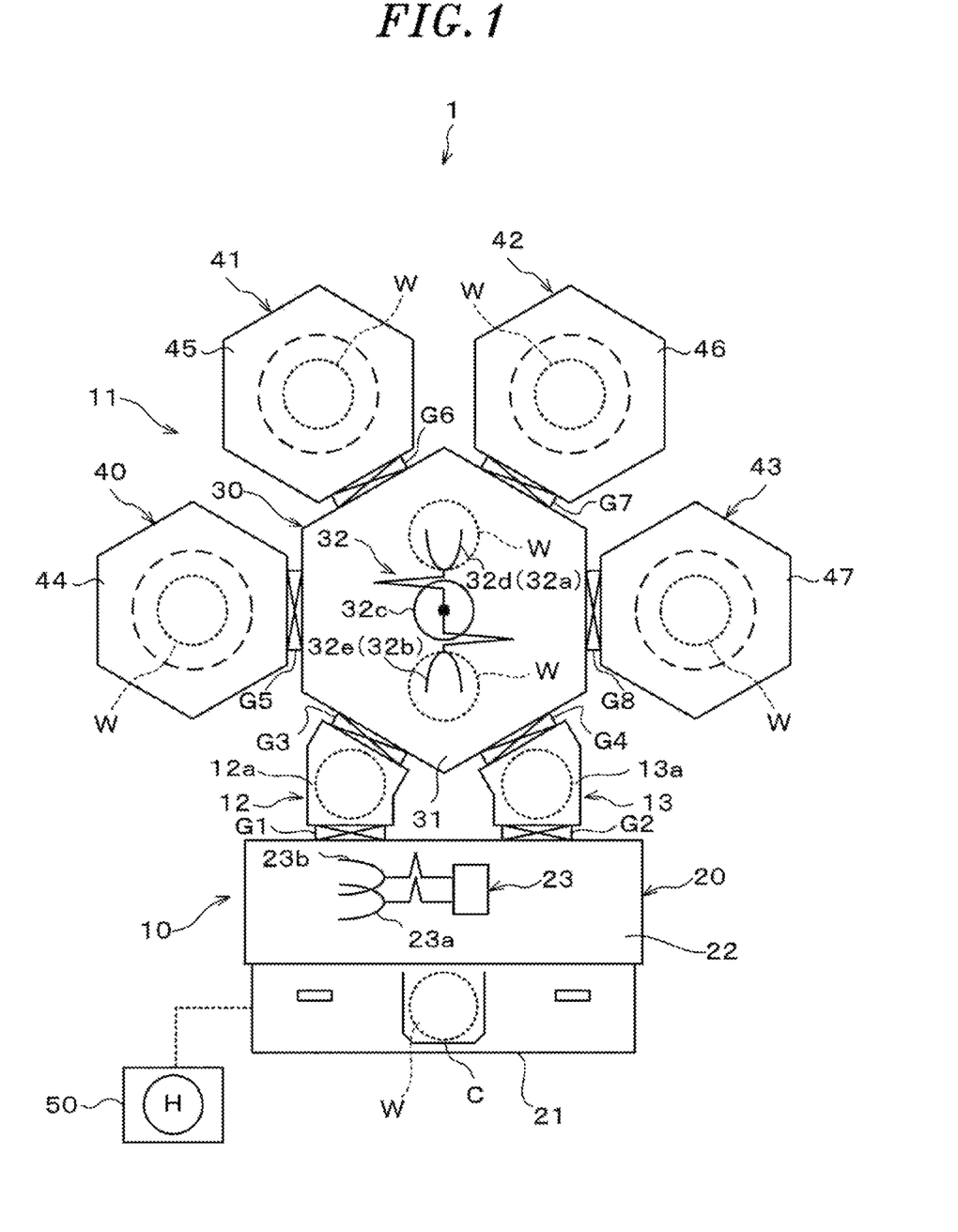
FIG. 1 is a plan view illustrating an outline of the configuration of a wafer processing system as a substrate processing system including a heating device according to a first embodiment.

FIG. 1 is a plan view illustrating an outline of the configuration of a wafer processing system 1 as a substrate processing system including a heating device according to a first embodiment. For example, the wafer processing system 1 performs predetermined processes such as a film forming process, a diffusion process, and an etching process on a wafer W, which is a substrate, under reduced pressure.

The wafer processing system 1 has a configuration in which a carrier station 10, where a carrier C capable of accommodating a plurality of wafers W is loaded and unloaded, and a processing station 11 having a plurality of various processing devices for performing predetermined processes on the wafer W under reduced pressure are integrally connected to each other. The carrier station 10 and the processing station 11 are connected to each other via two load lock devices 12 and 13.

The load lock devices 12 and 13 have housings forming the load lock chambers 12a and 13a configured so that states in the chambers can be switched between an atmospheric pressure state and a vacuum state. The load lock devices 12 and 13 are provided to connect an atmospheric pressure transport device 20 and a vacuum transport device 30 which will be described below. The load lock device 12 has a heating unit as described below and, in the present embodiment, also functions as a heating device for heating the wafer W. Specifically, the load lock device 12 functions as a heating device for heating the wafer W before the wafer W is transported to processing devices 40 to 43. The load lock device 13 is configured and functions in the same manner. The details of the configuration of the load lock device 12 will be described below.

The carrier station 10 has the atmospheric pressure transport device 20 and a carrier placement table 21. Moreover, the carrier station 10 may further include an aligner (not illustrated) for adjusting an orientation of the wafer W.

The atmospheric pressure transport device 20 has a housing that forms an atmospheric transport chamber 22, the inside of the chamber being under an atmospheric pressure. The atmospheric transport chamber 22 is connected to the load lock chambers 12a and 13a of the load lock devices 12 and 13 via gate valves G1 and G2. In the atmospheric transport chamber 22, a transport mechanism 23 for transporting the wafer W between the load lock chambers 12a and 13a under the atmospheric pressure is provided.

The transport mechanism 23 has two transport arms 23a and 23b. Each of the transport arms 23a and 23b is formed as a multi joint arm having a wafer holding unit as a substrate holding unit for holding the wafer W at a tip thereof. Moreover, the transport mechanism 23 is configured to transport the wafer W while holding the wafer W by any one of the transport arms 23a and 23b.

The carrier placement table 21 is provided on a side surface of the atmospheric pressure transport device 20 opposite to the load lock devices 12 and 13. In the illustrated example, a plurality of carriers C, for example, three carriers C, can be placed on the carrier placement table 21. The wafer W in the carrier C placed on the carrier placement table 21 is loaded in or unloaded or from the atmospheric transport chamber 22 by the transport arms 23a and 23b of the transport mechanism 23 of the atmospheric pressure transport device 20.

The processing station 11 has the vacuum transport device 30 and the processing devices 40 to 43.

The vacuum transport device 30 has a housing that forms a vacuum transport chamber 31 the inside of which is maintained in a decompressed state (vacuum state), and the housing is configured to be hermetically sealed and is formed to have a substantially polygonal shape (hexagonal shape in the illustrated example) in a plan view, for example. The vacuum transport chamber 31 is connected to the load lock chambers 12a and 13a of the load lock devices 12 and 13 via gate valves G3 and G4. In the vacuum transport chamber 31, a transport mechanism 32 for transporting the wafer W with respect to vacuum processing chambers 44 to 47, which will be described below, of the processing devices 40 to 43 is provided.

The transport mechanism 32 has two transport arms 32a and 32b and a base 32c. Each of the transport arms 32a and 32b is formed as a multi joint arm and has a transport pick 32d or 32e for holding the wafer W at a tip. The base 32c pivotally supports root portions of the transport arms 32a and 32b. Moreover, the transport mechanism 32 is configured to transport the wafer W while holding the wafer by any one of the transport arms 32a and 32b.

The processing devices 40 to 43 and the load lock devices 12 and 13 are disposed to surround a periphery of the housing forming the vacuum transport chamber 31 of the vacuum transport device 30. For example, in a plan view, the load lock device 12, the processing devices 40 to 43, and the load lock device 13, in this order, are disposed in a clockwise direction viewed from the load lock device 12, each facing side surface portions of the housing forming the vacuum transport chamber 31.

For example, the processing devices 40 to 43 perform predetermined processes such as a film forming process, a diffusion process, and an etching process on the wafer W under reduced pressure. Further, each of the processing devices 40 to 43 has a housing for forming vacuum processing chambers 44 to 47 in which the predetermined processes are performed on the wafer W under reduced pressure. The vacuum processing chambers 44 to 47 are connected to the vacuum transport chamber 31 of the vacuum transport device 30 via gate valves G5 to G8 which are sluice valves.

As the processing devices 40 to 43, a device that performs a process according to the purpose of wafer processing can be arbitrarily selected.

The above wafer processing system 1 includes a control device 50. The control device 50 is, for example, a computer including a central processing unit (CPU), a memory, or the like and has a program storage unit (not illustrated). The program storage unit stores a program that controls wafer processing in the wafer processing system 1. Specifically, the program storage unit stores a program for determining a transport schedule for each wafer W, a program for determining a processing schedule for each of the processing devices 40 to 43, or the like. These programs may be recorded on a computer-readable storage medium H and installed on the control device 50 from the storage medium H.

Figure 2:
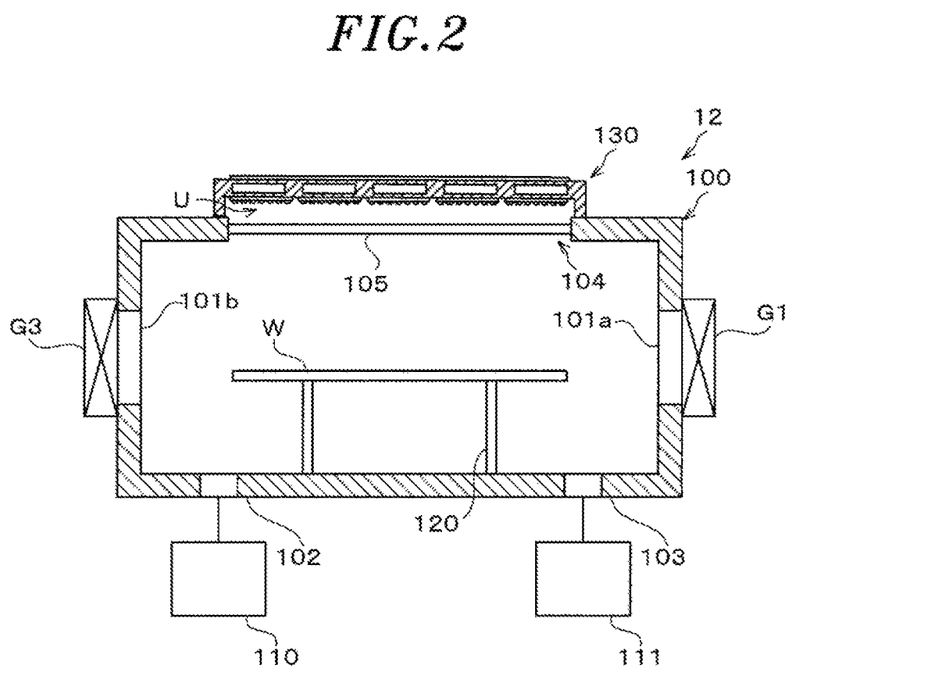
FIG. 2 is a vertical cross-sectional view illustrating an outline of the configuration of a load lock device.
Figure 3:
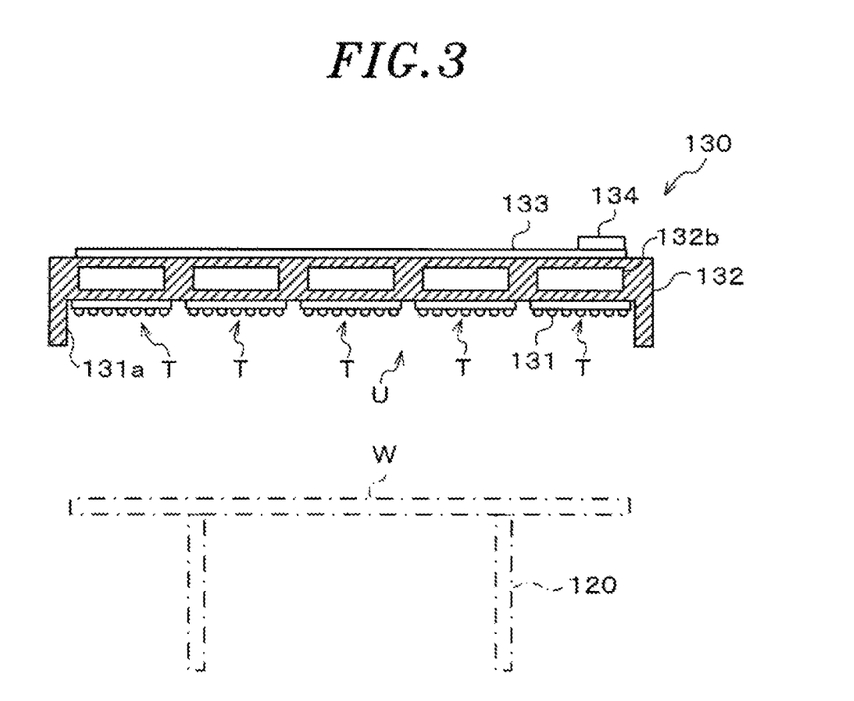
FIG. 3 is a cross-sectional view illustrating an outline of the configuration of a heating unit.
Figure 4:
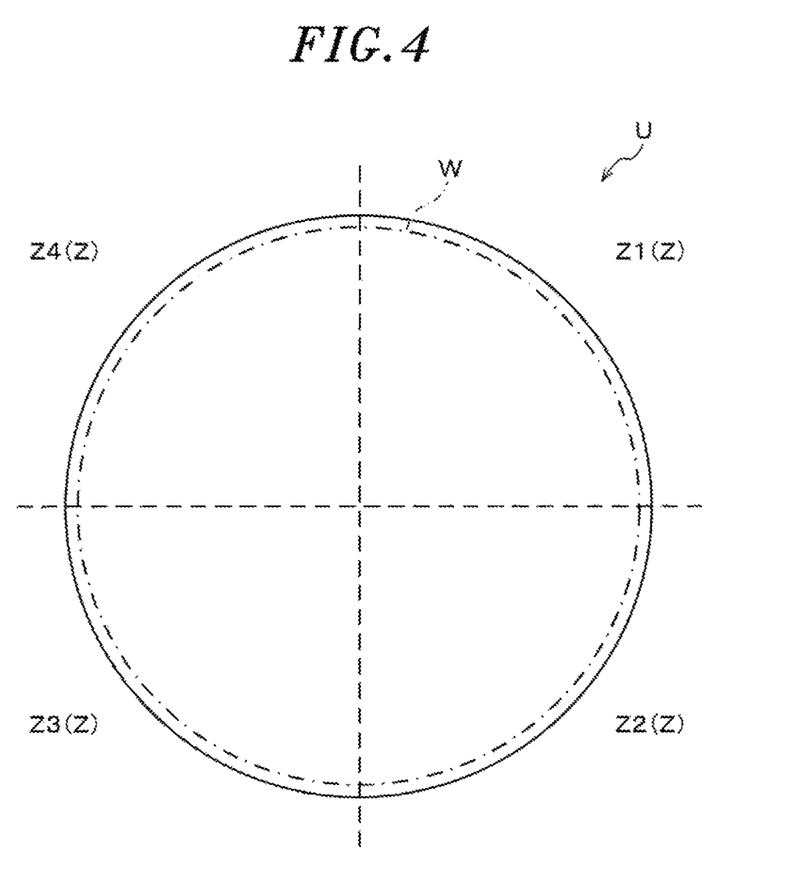
FIG. 4 is a plan view illustrating a mode of zone division of a light irradiation unit.
Figure 5:
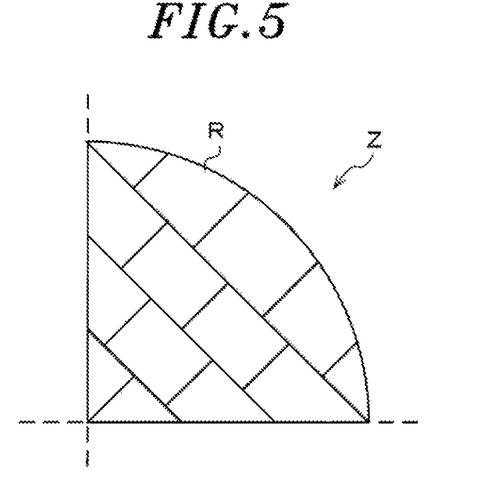
FIG. 5 is a plan view illustrating a mode of region division of each zone.
Figure 6:
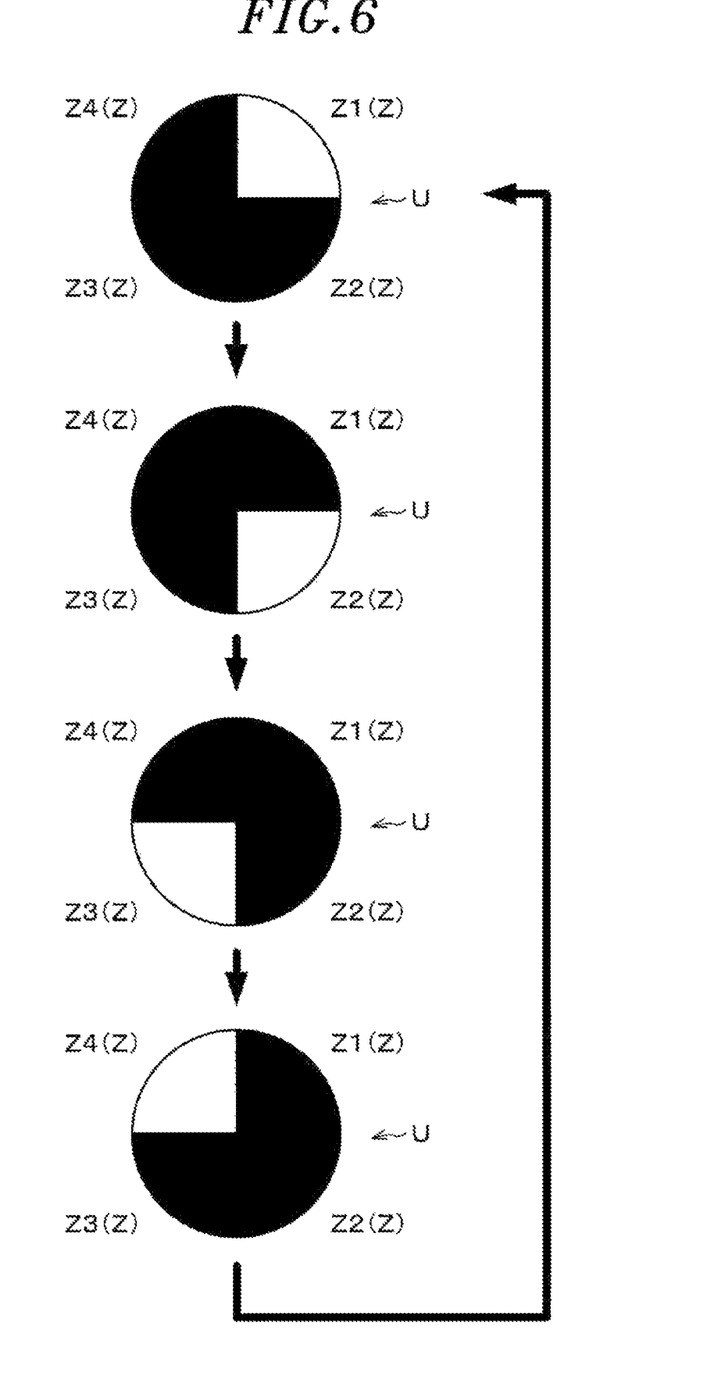
FIG. 6 is a diagram for describing a mode in which the zones take turns to be used for heating.

Subsequently, the load lock device 12 will be described with reference to FIGS. 2 to 6. FIG. 2 is a vertical cross-sectional view illustrating an outline of the configuration of the load lock device 12. FIG. 3 is a cross-sectional view illustrating an outline of the configuration of a heating unit described below. FIG. 4 is a plan view illustrating a mode of zone division of a light irradiation unit U described below. FIG. 5 is a plan view illustrating a mode of region division of each zone. FIG. 6 is a diagram for describing a mode in which the zones take turns to be used for heating, to be described below. Since the configuration of the load lock device 13 is the same as the configuration of the load lock device 12, description thereof will be omitted.

As illustrated in FIG. 2, the load lock device 12 has a housing 100 the inside pressure of which can be reduced. Loading/unloading ports 101a and 101b are formed on two opposing side walls of the housing 100, and the gate valves G1 and G3 are provided at the loading/unloading ports 101a and 101b.

An exhaust port 102 is formed in thd bottom wall of the housing 100 to reduce the atmosphere inside the housing 100 to a predetermined degree of vacuum. An exhaust mechanism 110 having a vacuum pump or the like is connected to the exhaust port 102.

Further, an air supply port 103 for returning the inside of the housing 100 to an atmospheric pressure atmosphere is formed in the bottom wall of the housing 100. For example, a gas supply mechanism 111 for supplying an inert gas such as N2 gas is connected to the air supply port 103.

Further, a plurality of rod-shaped support pins 120 as support portions for supporting the wafer W are provided inside the housing 100. Each support pin 120 is provided to extend upward from the bottom wall.

Further, an opening 104 is formed in the top wall of the housing 100, and an optical window 105 is provided to close the opening 104. The optical window 105 is formed of a material that transmits light from a light emitting diode (LED) described below.

A heating unit 130 for heating the wafer W, which is supported by the support pin 120, with light is provided above the optical window 105, which is the outside of the housing 100. The heating unit 130 is disposed to face the support pin 120 through the optical window 105.

As illustrated in FIG. 3, the heating unit 130 has a light irradiation unit U. The light irradiation unit U heats the wafer W supported by the support pin 120 by irradiating the wafer W with light. The light irradiation unit U has a shape corresponding to the wafer W in a plan view and is formed, for example, in a circular shape in a plan view.

This light irradiation unit U has, for example, a plurality of LEDs 131, which face the wafer W, as light emitting elements. Specifically, the light irradiation unit U has a plurality of units T in which the plurality of LEDs 131 are unitized. In each unit T, a plurality of LEDs 131 are connected in series. Moreover, as the light emitting element, a solid light emitting element other than the LED may be used.

Each LED 131 irradiates the wafer W with light. Each LED 131 emits light capable of heating the Si wafer W, for example, near-infrared light or ultraviolet light. The light (hereinafter, may be referred to as "LED light") emitted from the LED 131 passes through the optical window 105, and the light passing through the optical window 105 is incident on the wafer W supported by the support pin 120.

The light irradiation unit U is configured to be capable of irradiating the entire surface of the wafer W supported by the support pin 120 with the LED light from the entire light irradiation unit U.

Further, the heating unit 130 has a base 132 on which the light irradiation unit U is mounted. The base 132 is formed in a disk shape having a diameter slightly larger than that of the optical window 105 in a plan view and is supported by a portion of the housing 100 that surrounds the optical window 105. Further, for example, the base 132 has a recess 132a formed in the lower surface thereof, and the unit T of the light irradiation unit U is mounted in the recess 132a.

A cooling flow path 132b through which a refrigerant for cooling the LED 131 flows is formed above the recess 132a in the base 132. As the refrigerant, for example, cooling water is used. For example, the base 132 is formed of a metal material such as Al.

Further, the heating unit 130 has a control board 133 that controls the LED 131 to be turned on and off. The control board 133 includes, for example, a processor, a memory, or the like, and is mounted on the upper surface of the base 132. Further, the control board 133 is connected to a power source (not illustrated) that supplies electric power to the light irradiation unit U. Moreover, the control board 133 includes a single current sensor 134 which detects a current value of the electric power supplied to the light irradiation unit U. The detection result by the current sensor 134 is output to, for example, the control device 50.

In the heating unit 130, as illustrated in FIG. 4, the light irradiation unit U is divided into a plurality of zones (four in the example of FIG. 4). In other words, the plurality of (four in the example of FIG. 4) zones Z (Z1 to Z4) are set for the light irradiation unit U. In the present example, the plurality of zones Z (Z1 to Z4) are arranged in a circumferential direction (specifically, a circumferential direction centered on a central axis of the light irradiation unit U coinciding with a central axis of the wafer W supported by the support pin 120) of the light irradiation unit U, which coincides with a circumferential direction of the wafer W. In a plan view, the shape of each zone Z is, for example, a shape in which the light irradiation unit U is divided into a plurality of pieces at equal intervals in the circumferential direction thereof, and is a quadrant in the example of FIG. 4. In the following, the "circumferential direction" means the "circumferential direction of the light irradiation unit U".

Further, the light irradiation unit U irradiates the entire upper surface of the wafer W supported by the support pins 120 with the LED light from all the plurality of zones Z, but each zone irradiates different portions of the upper surface of the wafer W with the LED light. For example, each zone Z in the light irradiation unit U irradiates a portion of the upper surface of the wafer W facing said each zone Z with light to heat the wafer W.

As illustrated in FIG. 5, each zone Z is divided into a plurality of regions (14 regions in the example of FIG. 5). In other words, a plurality of regions R (14 regions in the example of FIG. 5) are set for each zone Z. One unit T described above is provided in each region R. The shapes of the regions R in a plan view may be different from one another as illustrated in FIG. 5.

Then, in the heating unit 130, when the wafer W supported by the support pin 120 is heated, under the control of the control board 133, the plurality of zones Z in the light irradiation unit U take turns so that some zones of the plurality of zones Z are utilized for heating. For example, under the control of the control board 133, as illustrated in FIG. 6, one zone Z in the light irradiation unit U (hereinafter, may be referred to as "heating zone") is used for heating, and the zones Z take turns clockwise in the circumferential direction. Specifically, the heating zones Z are sequentially chosen in the order of zone Z1→zone Z2→zone Z3→zone Z4→zone Z1. That is, under the control of the control board 133, the heating zones Z are sequentially chosen so that the heating zone Z rotates. The heating zone Z may switch, for example, every predetermined time period.

ON/OFF of the LED light and the intensity of the LED light (that is, light output of the LED 131) can be controlled for each unit T by the control board 133. Therefore, the light irradiation unit U can irradiate only a certain region(s) of the wafer W supported by the support pin 120 with the LED light or apply different intensities of the irradiated light to different regions for each zone. Therefore, the light irradiation unit U can locally change the heating mode of the wafer W supported by the support pin 120.

Further, in the heating unit 130, turning-on of the LED 131 of the light irradiation unit U is controlled, the current value of the electric power supplied to the light irradiation unit U at that time is detected by the current sensor 134, and disconnection of the unit T is detected based on the detection result. Specifically, the turning-on control of the LED 131 is performed simultaneously only for some zones (one zone in the following example) of the plurality of zones Z in the light irradiation unit U, and based on the detection result by the current sensor 134 at that time, the disconnection of the units T belonging to that zones Z where the turning-on control is performed is detected. The "turning-on control of the LED 131" means a control performed so that the LED 131 is turned on to output a predetermined amount of light.

The reason why one zone Z of the plurality of zones Z in the light irradiation unit U is chosen for the turning-on control of the LED 131 when the disconnection of the unit T is detected, is as follows.

That is, when the turning-on control of the LED 131 is performed for all the plurality of zones Z (in other words, for all the units of the light irradiation unit U), the change in the detection result of the current sensor 134 due to the disconnection of one unit T would be small. For example, when there are four zones Z, 14 units T are provided in one zone Z, and the total number of units T is 56, the change that occurs in the detection result of the current sensor 134 due to the disconnection of one unit T is as small as 1.8%. As described above, when the change that occurs in the detection result of the current sensor 134 due to the disconnection of the unit T is small, it is difficult to accurately detect the disconnection based on the detection result of the current sensor 134.

When the turning-on control of the LED 131 is performed only for one of the plurality of zones Z, the disconnection of one unit T belonging to that zone Z causes a large change in the detection result of the current sensor 134. For example, when 14 units T are provided in one zone Z as described above, the change that occurs in the detection result of the current sensor 134 due to the disconnection of one unit T is as large as about 7%. As described above, when the disconnection of the unit T causes a large change in the detection result of the current sensor 134, the disconnection can be accurately detected based on the detection result of the current sensor 134.

The disconnection of the unit T based on the detection result of the current sensor 134 described above is detected by, for example, the control device 50.

Next, an example of wafer processing performed using the wafer processing system 1 configured as described above will be described.

First, the transport arm 23*a* of the transport mechanism 23 is inserted into the carrier C to hold one wafer W. Next, the transport arm 23*a* is pulled out of the carrier C, the gate valve G1 is opened, and then the transport arm 23*a* is inserted from the atmospheric pressure transport device 20 into the housing 100 of the load lock device 12. Accordingly, the wafer W is delivered from the transport arm 23*a* to the support pin 120.

Subsequently, the transport arm 23*a* is pulled out of the housing 100 of the load lock device 12, and the gate valve G1 is closed to seal the inside of the housing 100 of the load lock device 12 to reduce the pressure. The heating by the light irradiation unit U of the heating unit 130 starts at the same time as the start of the pressure reduction or after the start of the pressure reduction.

During the heating by the light irradiation unit U, under the control of the control board 133, the heating zone Z is switched in the circumferential direction as described above. Further, during the heating by the light irradiation unit U, the intensity of the LED light of the unit T belonging to the heating zone Z is feedback controlled so that a portion of the wafer W irradiated with the LED light reaches a target temperature, based on a measurement result by a thermometer (not illustrated).

Further, during the heating, the control device 50 detects the disconnection of the unit T belonging to the zone Z designated as the heating zone Z based on the detection result by the current sensor 134. In the control device 50, for example, whether the disconnection occurs is detected based on whether a difference between the detection result by the current sensor 134 and that of the normal state (when the disconnection of the unit T does not occur at all) exceeds a threshold value. Further, the detection of this disconnection is always performed at an initial stage of heating by the light irradiation unit U, for example, and is not performed after the initial stage, for the following reason: The feedback control is performed as described above, and thus, the light output of each LED 131 is fixed at the maximum output in the initial stage of the heating by the light irradiation unit U. But the light output differs for each LED 131 as the temperature of the wafer W is getting close to the target temperature, and even when there is no disconnection, the detection result by the current sensor 134 is changed.

The detection result (current value) by the current sensor 134 in the normal state and the above threshold value are stored in, for example, a memory (not illustrated) of the control board 133 in advance.

When the wafer W is to be unloaded from the load lock device 12, the heating by the light irradiation unit U ends, the gate valve G3 is opened, and the inside of the load lock device 12 and the inside of the vacuum transport device 30 communicate with each other. Then, the transport pick 32*d* of the transport mechanism 32 is inserted into the housing 100 of the load lock device 12, and receives and holds the wafer W from the support pin 120. Next, the transport pick 32*d* is pulled out of the housing 100 of the load lock device 12, and thus, the wafer W is transported from the load lock device 12 to the vacuum transport device 30.

Next, after the gate valve G3 is closed, the gate valve G5 for a processing device (here, the processing device 40) that performs a desired processing is opened. Subsequently, the transport pick 32*d* holding the wafer W is inserted into the vacuum processing chamber 44 of the processing device 40 with a reduced pressure, and the wafer W is delivered to the placement table (not illustrated) or the like in the vacuum processing chamber 44.

After that, the transport pick 32*d* is pulled out of the vacuum processing chamber 44, the gate valve G5 is closed, and the vacuum processing chamber 44 is sealed. After that, in the vacuum processing chamber 44, a predetermined process for the wafer W is performed at a processing temperature higher than room temperature. The temperature higher than room temperature is, for example, 80° C. or higher. In the technology according to the present disclosure, the heating is performed by the light from the LED 131 which is a solid light emitting element and can be performed at a high speed to a target temperature.

Accordingly, the technology can be applied even when the processing temperature in the processing device 40 is 700° C. or higher.

After the predetermined process ends, the gate valve G5 is opened. Then, the transport pick 32*d* is inserted into the vacuum processing chamber 44 to receive and hold the wafer W. Next, the transport pick 32*d* is pulled out of the vacuum processing chamber 44, and thus, the wafer W is unloaded from the vacuum processing chamber 44 to the vacuum transport device 30. After that, the gate valve G5 is closed.

Next, the gate valve G3 is opened. Then, the transport pick 32d is inserted into the housing 100 of the load lock device 12, and the wafer W is delivered from the transport pick 32d to the support pin 120. Subsequently, the transport pick 32d is pulled out of the housing 100 of the load lock device 12, the gate valve G3 is closed, and then the inside of the housing 100 is set to atmospheric pressure.

Next, after the gate valve G1 is opened, the transport arm 23a of the transport mechanism 23 is inserted into the housing 100 of the load lock device 12 and receives and holds the wafer W from the support pin 120. Next, the transport arm 23a is pulled out of the housing 100 of the load lock device 12, and the gate valve G1 is closed. Then, the transport arm 23a is inserted into the carrier C, the wafer W is delivered and stored in the carrier C, and then the transport arm 23a is pulled out of the carrier C. Thus, a series of wafer processing is completed in the wafer processing system 1.

The above-described series of processes is performed on, for example, all the wafers W accommodated in the carrier C.

As described above, in the present embodiment, the load lock devices 12 and 13 that also function as the heating devices include the light irradiation unit U. In this light irradiation unit U, a plurality of zones Z are set, and different portions on the upper surface of the wafer W supported by the support pins 120 for each zone Z are illustrated with light. Moreover, in the present embodiment, during the heating by the light irradiation unit U, the plurality of zones Z take turns so that some of the plurality of zones are utilized for the heating. Therefore, the entire wafer W supported by the support pin 120 can be heated without using all the plurality of zones Z at the same time, that is, without using all the LEDs 131 mounted on the light irradiation unit U at the same time. Therefore, according to the present embodiment, the entire wafer W can be heated by the light from the LED 131 even when a power source having low output power with respect to the light irradiation unit U is used. As a result, it is possible to realize cost reduction and miniaturization of the load lock devices 12 and 13 that also function as the heating device.

Further, in the present embodiment, as described above, when the turning-on control of the LED 131 is performed for some zones Z among the plurality of zones Z, the disconnection of the units T belonging to that zones Z is detected based on the detection result by the current sensor 134. Therefore, even when there is only one current sensor 134, it is possible to accurately detect the presence or absence of disconnection in the plurality of units T at the same time. That is, it is not necessary to provide a plurality of current sensors 134 in order to detect the presence or absence of disconnection in the plurality of unit units T. Therefore, even when a mounting space of the current sensor 134 is limited, it is possible to accurately detect the presence or absence of disconnection in the plurality of unit units T at the same time.

Further, in this detection method, the disconnection of the unit T can be detected while the heating zones Z in the light irradiation unit U are sequentially switched to heat the wafer W. Therefore, even when the unit T is disconnected during the heating, the disconnection can be detected.

The disconnection of the unit T by the above method may be detected at the time of replacing the wafer W or at the time of maintenance.

In the above example, the disconnection of the unit T is detected for each zone Z in the light irradiation unit U. Instead of this, the turning-on control of the LED 131 is simultaneously performed for a plurality of (for example, four) units T selected regardless of the zone Z, and the disconnection of the units T for which the turning-on control is performed may be detected based on the detection result by the current sensor 134 at that time.

Second Embodiment

Figure 7:
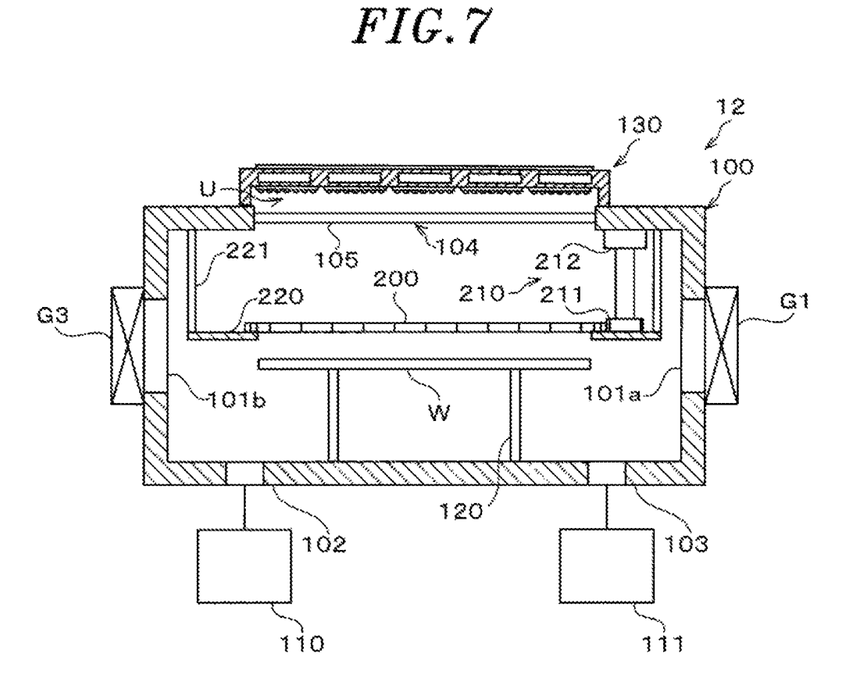
FIG. 7 is a vertical cross-sectional view illustrating an outline of the configuration of a load lock device as a heating device according to a second embodiment.
Figure 8:
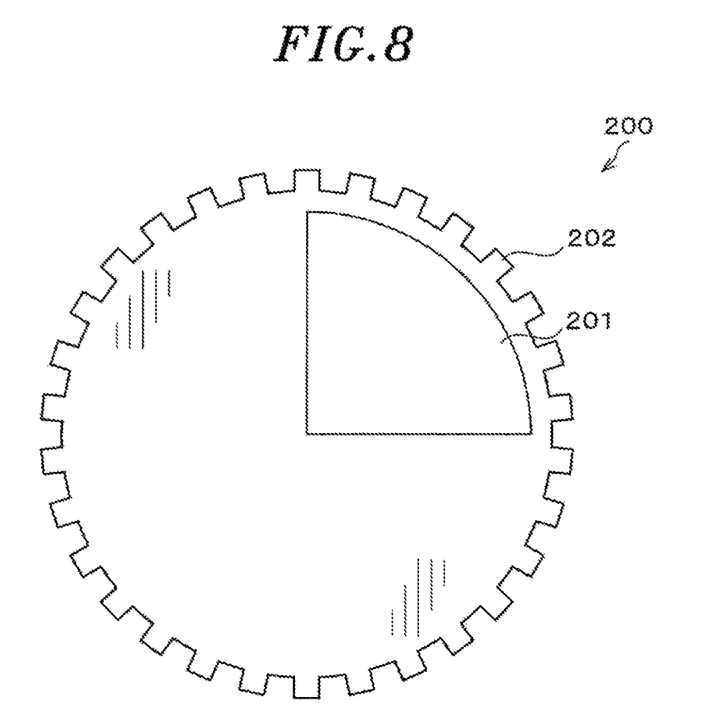
FIG. 8 is a plan view illustrating an outline of the configuration of a heat insulating plate.

FIG. 7 is a vertical cross-sectional view illustrating an outline of the configuration of a load lock device as a heating device according to a second embodiment. FIG. 8 is a plan view illustrating an outline of the configuration of a heat insulating plate described below.

In addition to each component of the load lock device 12 illustrated in FIG. 2 and the like, a load lock device 12 of FIG. 7 includes a heat insulating plate 200 which suppresses a temperature drop of a portion of the wafer W supported by the support pin 120 that is not subject to the heating by the light irradiation unit U, and a rotation mechanism 210 which rotates the heat insulating plate 200.

The heat insulating plate 200 is formed of a metal material such as stainless steel in a plate shape, which easily reflects heat from the wafer W, for example. In addition, in order to further reflect the heat from the wafer W, at least a portion of the heat insulating plate 200 facing the wafer W may be mirror-finished.

The heat insulating plate 200 is provided, for example, at a position between the wafer W supported by the support pin 120 and the light irradiation unit U, and as illustrated in FIG. 8, an opening 201 through which the LED light passes is formed. The opening 201 is formed to move in the circumferential direction when the heat insulating plate 200 rotates about a central axis thereof (that is, a central axis of the wafer W supported by the support pin 120). Further, the opening 201 has a shape corresponding to the zone Z of the light irradiation unit U, and in the present example, the opening 201 has a quadrant shape.

Teeth 202 that mesh with a small gear, which is described below, of the rotation mechanism 210 are formed on the entire outer peripheral surface of the heat insulating plate 200.

The rotation mechanism 210 has a small gear 211 and a drive source 212 as illustrated in FIG. 7.

As the small gear 211 rotates, the small gear 211 rotates the heat insulating plate 200 having the teeth 202, which mesh with the small gear 211, on the outer peripheral surface.

The drive source 212 has an actuator (not illustrated) such as a motor and generates a driving force for rotating the small gear 211.

The heat insulating plate 200 is supported from below by the support plate 220. The support plate 220 itself is supported by, for example, a support column 221 extending downward from the top wall of the housing 100. A guide protrusion (not illustrated) for guiding the rotation of the heat insulating plate 200 is provided on the upper surface of the support plate 220, and a recess (not illustrated) in which the guide protrusion is accommodated is provided in an annular shape in the lower surface of the heat insulating plate 200 in a plan view.

In the present embodiment, during the heating by the light irradiation unit U, the rotation mechanism 210 rotates the heat insulating plate 200 in synchronization with the switching of the heating zone Z. As a result, the opening 201 of the heat insulating plate 200 and the heating zone Z always face each other, and a portion of the wafer W that is not subject to the heating by the light irradiation unit U can be covered with a non-open portion of the heat insulating plate 200.

Therefore, when the heating zone is switched in the circumferential direction to heat the wafer W, the wafer W can be efficiently heated.

In this example, the heat insulating plate 200 is provided between the wafer W supported by the support pin 120 and the light irradiation unit U, that is, above the wafer W. Alternatively, or in addition to this, the heat insulating plate 200 may be provided below the wafer W, that is, in a space facing the light irradiation unit U with the wafer W interposed therebetween. In this case, the rotation mechanism 210, the opening 201, and the teeth 202 are omitted, and a through hole through which the support pin 120 passes is provided in the heat insulating plate 200.

Figure 9:
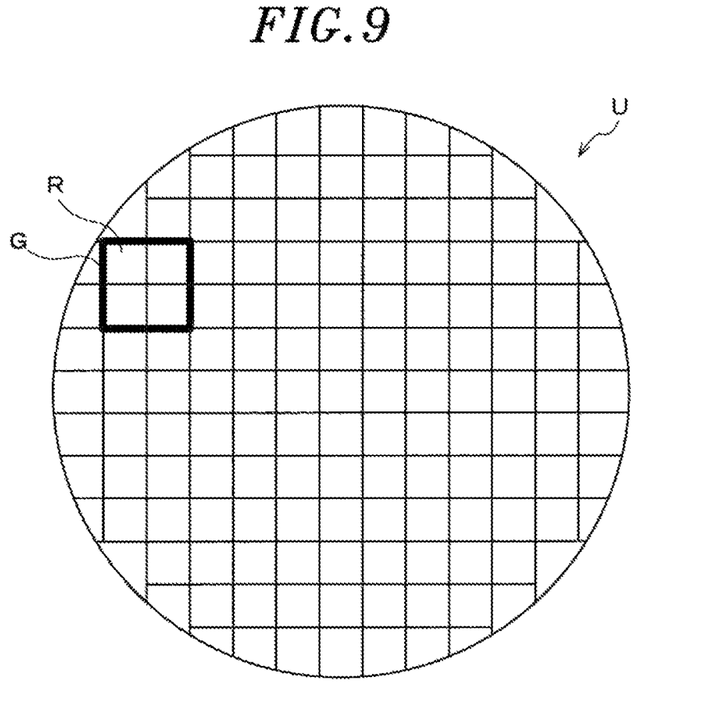
FIG. 9 is a plan view for describing another example of the zone division of the light irradiation unit.
Figure 10:
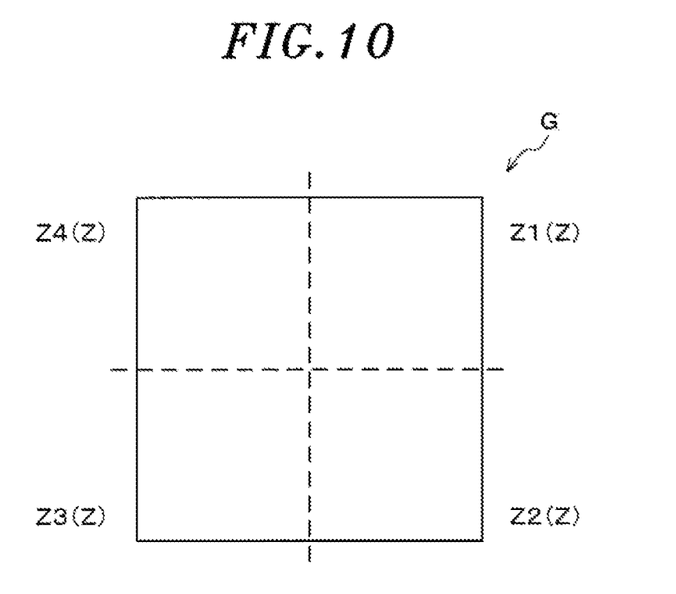
FIG. 10 is a plan view illustrating an outline of a region group.

FIG. 9 is a plan view for describing another example of the zone division of the light irradiation unit U. FIG. 10 is a plan view illustrating an outline of a region group described below.

In the above example, the zone division of the light irradiation unit U is performed so that the zones Z are lined up in the circumferential direction.

The zone division of the light irradiation unit U is not limited to this example. For example, as illustrated in FIG. 9, a plurality of regions R may be set for the light irradiation unit U so as to be arranged in a grid pattern, and the plurality of regions R may be grouped into a region group G for each predetermined range. Moreover, as illustrated in FIG. 10, each region group G may be divided into zones, that is, a plurality of zones Z (four zones Z1 to Z4 in the example of FIG. 10) may be set. Then, for each region group G, the heating zone Z may be switched in the order of zone Z1→zone Z2→zone Z3→zone Z4→zone Z1. In this case, the arrangement of the plurality of zones Z may be common for the region groups G. By making the arrangement common, it is possible to make the regions heated at the same time evenly distributed in the wafer surface.

Figure 11:
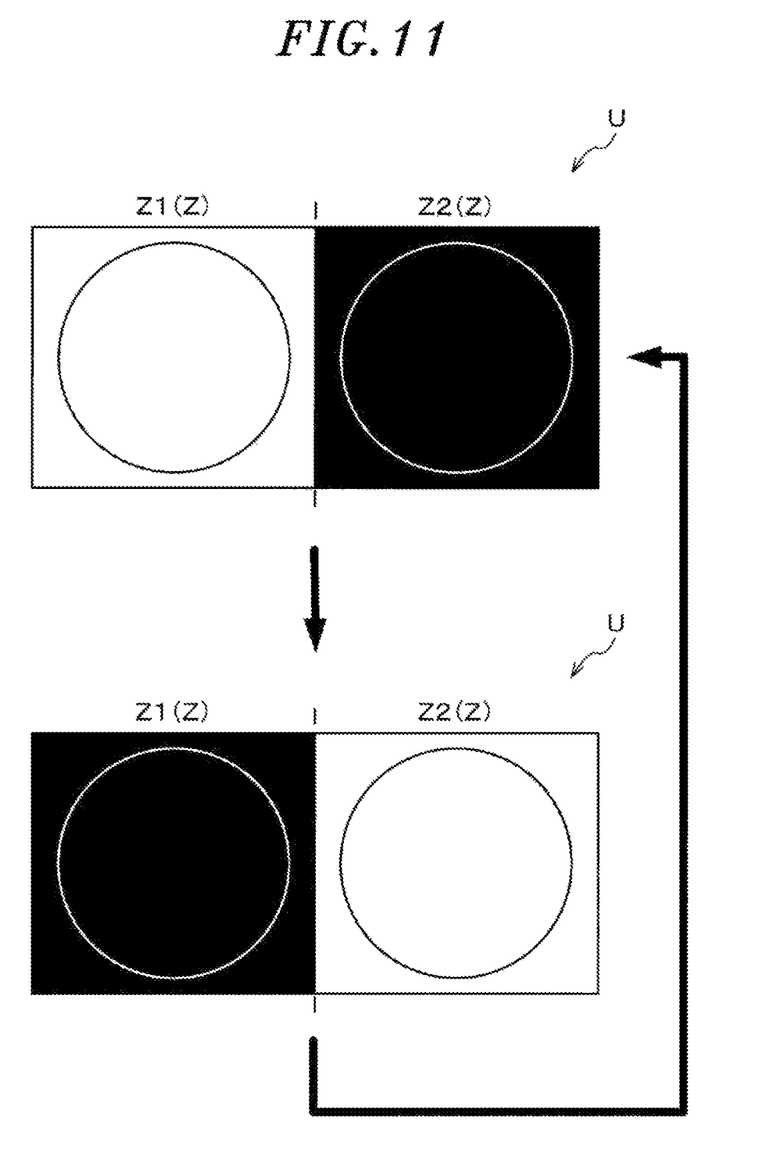
FIG. 11 is a diagram illustrating still another example of the zone division of the light irradiation unit.

FIG. 11 is a diagram illustrating still another example of the zone division of the light irradiation unit U.

The above example is an example in which one wafer W is heated by one light irradiation unit U. A single light irradiation unit U may heat a plurality of wafers W at the same time. In this case, the zone division of the light irradiation unit U may be performed on a wafer level. For example, when two wafers W are heated at the same time, the zone Z1 is assigned to one wafer W, the zone Z2 is assigned to the other wafer W, and as illustrated in FIG. 11, the heating zone is switched alternately between the zone Z1 and zone Z2.

The "one light irradiation unit U" used in the above description also corresponds to a set of two separate light irradiation units U having a common power supply. For example, the light irradiation unit U of the load lock device 12 and the light irradiation unit U of the load lock device 13 are separate bodies, but when the power supply is common, the set of light irradiation units U also corresponds to "one light irradiation unit U".

In the above example, the load lock devices 12 and 13 constitute the heating device having the light irradiation unit U. Instead of this, the heating device having the light irradiation unit U may be provided separately from the load lock devices 12 and 13 and connected to the vacuum transport device 30.

Further, in the above example, in the heating unit 130, the ON/OFF of the LED light and the intensity of the LED light are controlled in the unit of the unit T in which a plurality of LEDs 131 are unitized but may be controlled in the unit of the LED 131.

The embodiments disclosed here should be considered to be exemplary in all respects and not restrictive. The above embodiments may be omitted, replaced or modified in various forms without departing from the scope of the appended claims and their gist.

What is claimed is:

1. A heating device for heating a substrate, comprising:
a support portion configured to support the substrate;
a light irradiation unit configured to heat the substrate by irradiating the substrate supported by the support portion with light;
an optical window provided between the support portion and the light irradiation unit;
a heat insulating plate configured to suppress a temperature drop of a portion, which is not subject to the heating by the light irradiation unit, of the substrate supported by the support portion; and
a rotation mechanism configured to rotate the heat insulating plate,
wherein a plurality of zones are set in the light irradiation unit, and each of the plurality of zones set in the light irradiation unit irradiates different portions of a surface of the substrate supported by the support portion with light,
during the heating by the light irradiation unit, the plurality of zones take turns so that some zones of the plurality of zones are utilized, and
the heat insulating plate is provided at a position between the substrate supported by the support portion and the light irradiation unit and between the support portion and the optical window, and includes an opening through which the light passes.

2. The heating device of claim 1,
wherein the plurality of zones are arranged in a circumferential direction, and
during the heating by the light irradiation unit, the plurality of zones take turns in the circumferential direction so that said some zones of the plurality of zones are utilized, and the rotation mechanism rotates the heat insulating plate in synchronization with the turns.

3. The heating device of claim 2, further comprising a single current sensor configured to detect a current value of electric power supplied to the light irradiation unit,
wherein the light irradiation unit includes a plurality of units, each including light emitting elements for emitting the light, for each zone, and
when turning-on control of the light emitting element is performed for said some zones of the plurality of zones, disconnection of the units in said some zones subject to the turning-on control is detected based on a detection result by the current sensor.

4. The heating device of claim 3, wherein the detection of the disconnection of the units is performed during the heating by the light irradiation unit.

5. The heating device of claim 2, wherein the heating device is configured as a load lock device for delivering the substrate provided between a vacuum atmosphere space and an atmospheric pressure atmosphere space.

6. The heating device of claim 1, further comprising a single current sensor configured to detect a current value of electric power supplied to the light irradiation unit,
wherein the light irradiation unit includes a plurality of units, each including light emitting elements for emitting the light, for each zone, and
when turning-on control of the light emitting element is performed for said some zones of the plurality of zones, disconnection of the units in said some zones subject to the turning-on control is detected based on a detection result by the current sensor.

7. The heating device of claim 6, wherein the detection of the disconnection of the units is performed during the heating by the light irradiation unit.

8. The heating device of claim 1, wherein the heating device is configured as a load lock device for delivering the substrate provided between a vacuum atmosphere space and an atmospheric pressure atmosphere space.

* * * * *